United States Patent

Degani et al.

[11] Patent Number: 5,869,894
[45] Date of Patent: Feb. 9, 1999

[54] RF IC PACKAGE

[75] Inventors: Yinon Degani, Highland Park; Peter R. Smith, Westfield; King Lien Tai, Berkeley Heights, all of N.J.

[73] Assignee: Lucent Technologies Inc., Murray Hill, N.J.

[21] Appl. No.: 896,917

[22] Filed: Jul. 18, 1997

[51] Int. Cl.⁶ .......................... H01L 23/34; H01L 23/02; H01L 23/48; H01L 23/52
[52] U.S. Cl. .......................... 257/723; 257/685; 257/686; 257/777; 257/778; 257/728
[58] Field of Search .................................... 257/685, 686, 257/723, 777, 778, 728

[56] References Cited

U.S. PATENT DOCUMENTS 5,198,963  3/1993  Gupta et al. ............................ 257/737
5,608,262  3/1997  Degani et al. ......................... 257/723
5,646,828  7/1997  Degani et al. ......................... 361/715

Primary Examiner—Teresa M. Arroyo

[57] ABSTRACT

The specification describes a MCM IC package with improved RF grounding. The package has at least one RF IC chip bonded to an interconnect substrate and the substrate is interconnected to an intermediate printed wiring board (IPWB). The IPWB is interconnected in turn to a system printed wiring board (SPWB). The RF IC chip is metallized on the backside, and is flip chip bonded directly to the SPWB thereby eliminating two intermediate interconnections and reducing the impedance of the interconnection between the RF chip and the SWBP.

7 Claims, 1 Drawing Sheet

RF IC PACKAGE

FIELD OF THE INVENTION

This invention relates to multi-chip module (MCM) integrated circuit packages and more specifically to MCM packages containing at least one RF chip.

BACKGROUND OF THE INVENTION

In integrated circuit packages containing RF chips noise problems frequently arise due to interconnects that are long or ineffectively placed. It is well known that electrical leads in and adjacent to RF circuit components act as antennae for stray signals that are inevitably present in an integrated circuit environment. The problem becomes more complex as the size of the IC chips is reduced and packaging techniques for IC chips and modules containing IC chips (MCMs) become more dense and efficient. Primary noise receivers in the RF circuit are the connections to the ground plane, and any expedient that reduces the length and impedance of these RF IC connections to the RF ground plane should significantly improve the noise performance of the RF circuit.

STATEMENT OF THE INVENTION

We have developed an improved method for grounding an IC chip in a MCM interconnect system. In such a system, a preferred arrangement is to flip chip bond the individual chips to a MCM tile, mount the MCM tile on an intermediate printed wiring board (IPWB) which in turn in mounted on a system board (SPWB). In such an arrangement, typically three interconnections are made between the chip and the system board, i.e. chip to MCM, MCM to IPWB and IPWB to SPWB. In our improved interconnect arrangement, the ground interconnection for the RF chip is made directly between the chip and the SPWB, thus reducing the length and impedance of the conventional ground connection.

DETAILED DESCRIPTION

Figure 1:
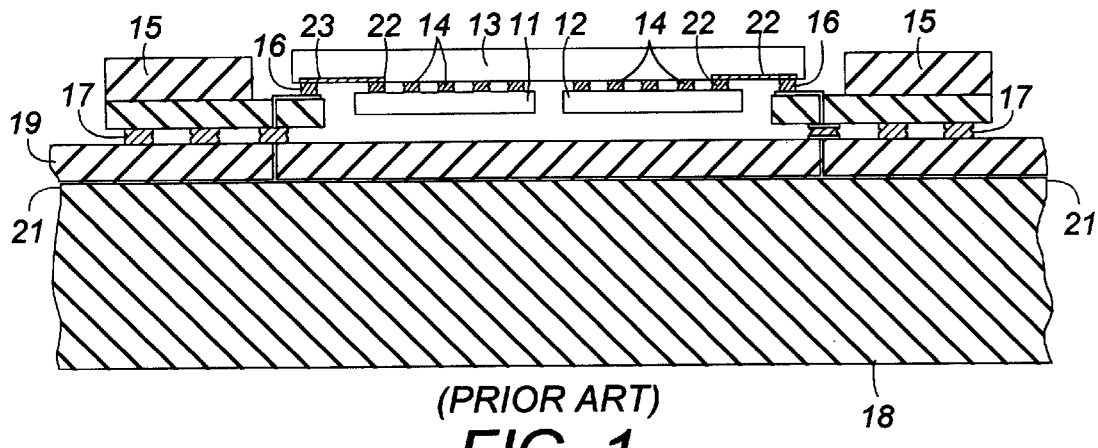
FIG. 1 is a schematic representation in partial cross section of a conventional interconnection system as described above.

Referring to FIG. 1, a multi-chip tile is shown comprising IC chips 11 and 12, and substrate 13. The IC 11 in this arrangement is an RF chip. Chip 12 is not an RF chip, e.g. a logic or memory chip. This choice is for illustration. The interconnection of any combination of IC chips that includes at least one RF chip, or an RF chip alone in the MCM tile, can be implemented following the teachings of the invention. The MCM tile may also contain passive components, e.g. capacitors, inductors, and resistors. A typical arrangement is an RF circuit chip and a capacitor mounted on the substrate 13. The substrate can be laminate, ceramic, silicon, or other appropriate material. The chips 11 and 12 are flip chip bonded to substrate 13 by interconnections 14 such as solder or conductive epoxy. The technique used for the flip chip bond is not part of the invention and may e.g. be solder bump, ball bonding, or conductive epoxy etc. The MCM tile 13 is in turn flip bonded to intermediate printed wiring board (IPWB) 15 with solder or conductive epoxy I/O interconnections 16. In this arrangement the (IPWB) 15 is shown as an multilevel board, but may be single level. The IPWB is in turn interconnected to a system board (SPWB) 18 by solder or conductive epoxy interconnections 17. The SPWB may also be single or multilevel, and is shown here with a separate level 19. A cutway portion of the SPWB is shown to illustrate that the system board may be considerably larger than the IPWB to accommodate several IPWBs.

Typically, the interconnect elements 13 and 15 are quad packages with a large array of I/O bonding sites arranged in a square or rectangular configuration. In the section shown in the figures, a single interconnection for the ground connection is shown to illustrate the invention. The ground connection is designated 22 on the chip 11 and 12, and connects to the SPWB via the interconnect substrate runners 23, the solder interconnections 16, through the IPWB and the interconnections 17, to the common ground plane 21 of the SPWB. In the conventional arrangement, the ground connection for all chips is made in essentially the same way. The remaining I/O connections are not shown but are also conventional.

Figure 2:
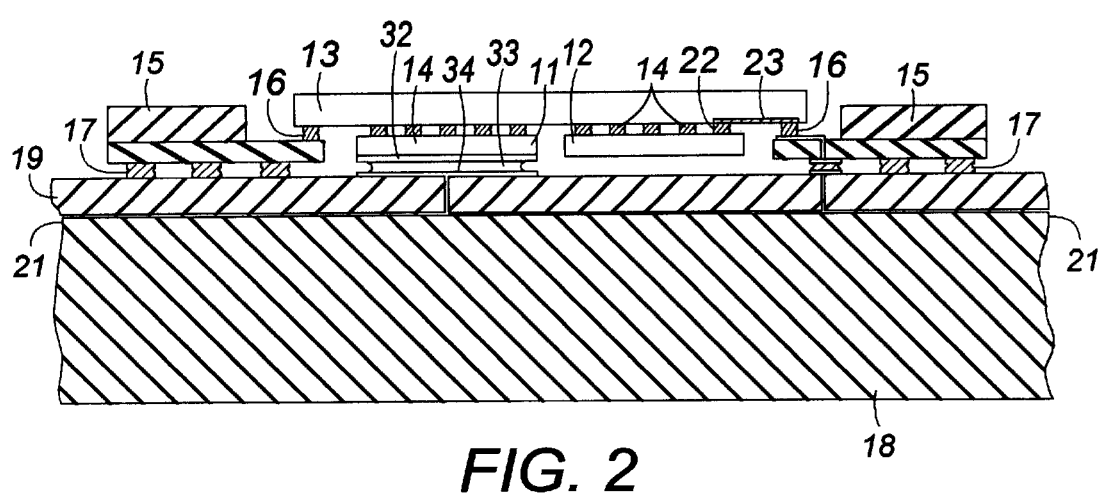
FIG. 2 is a view similar to that of FIG. 1 showing the improved RF ground interconnection according to the invention.

Turning to the improved arrangement shown in FIG. 2, the elements common to both figures have the same reference numbers. The change is evident in the manner in which the ground connection is made between the RF chip 11 and the common ground plane 21 of the SPWB. The backside of the RF chip is metallized with metallization layer 32. Metallizing the backside of the RF chip is made possible by the flip chip bonding arrangement. As will be apparent to those skilled in the art, the metallization should be applied directly to the semiconductor and any oxide that has been grown or deposited, or native oxide formed during processing, should be removed prior to metallization. It is preferred to apply the metallization to the chip at the wafer stage, where it can be applied at any convenient point in the wafer fabrication sequence. The material used for the metallization can be any appropriate conductive material, e.g. Au, Cr/CrCu/Cu, TiPdAu, Al. A solder wettable metal or metal such as TiPdAu is preferred as it can facilitate direct soldering to the ground pad 34.

The metallized RF chip is then bonded by conductive material 33 directly to a ground plane pad 34 on the SPWB. The ground plane pad 34 is part of the common ground 21 of the SPWB. It is preferable to locate the common ground plane 21 on the same level as the bond pad 34, but alternative arrangements, like those shown in these figures, are also effective. Preferably, the bond 33 between the RP chip and the SPWB is made at the same time the IPWB is interconnected to the SPWB.

There are various appropriate alternatives for the bonding material and the bonding technique. The preferred approach is to effect bonds 33 in the same way as bonds 17 using a standard surface mount approach. Thus if solder paste is used for interconnecting the IPWB with the SPWB, solder paste interconnection is made between RF chip 11 and SPWB 18 in the same step. Another choice would be to use conductive epoxy for the interconnection 33. Solder bumps or balls could also be used.

The other chip 12 shown in FIG. 2, which in this example is not an RF chip, may be grounded to SPWB in the conventional way as shown here, or it may be grounded in the same manner as RP chip 11.

In some cases it may be possible to bond the RF semiconductor chip directly to the SPWB bonding pad, without additional metallization of the chip substrate. However, in nearly all cases the resistance of the ground connection will be less if the semiconductor substrate is metallized. Moreover, metallization generally improves adhesion and promotes effective bonding.

Figure 3:
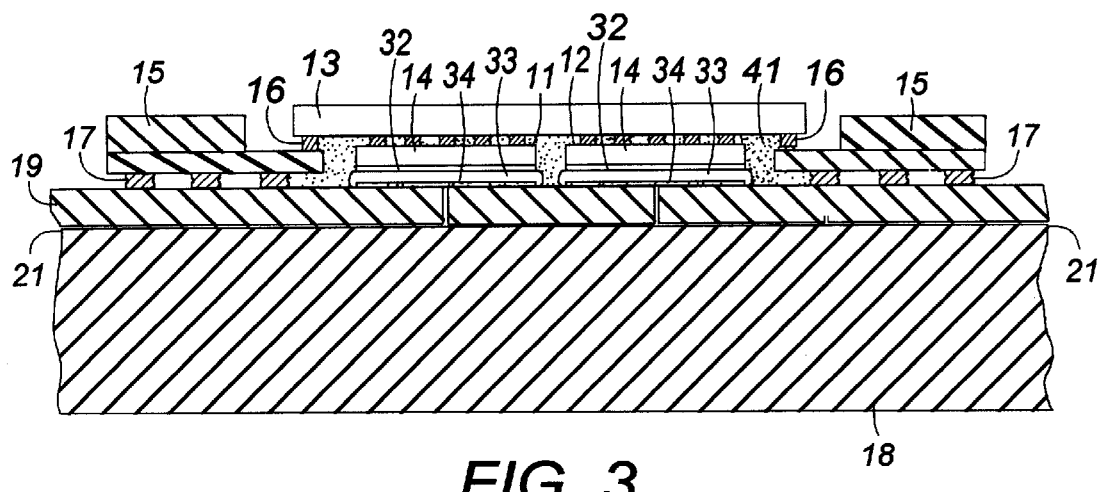
FIG. 3 is a view similar to that of FIG. 2 showing an alternative embodiment.

An embodiment alternative to that of FIG. 2 is shown in FIG. 3. Here, all common reference numbers denote the same elements as in FIG. 2, and bond 33 is preferably a conductive epoxy bond. In flip chip arrangements like that described here, it is conventional to fill the gap between the chips and the SPWB with epoxy underfill, mainly for mechanical reasons, i.e. the physical integrity of the package. In the arrangement of FIG. 3, the epoxy filling material is shown at 41. Chip 12 is shown grounded in the same manner as chip 11. It may be most convenient to apply the filling material prior to assembling the MCM tile in the IPWB, or prior to assembling the IPWB on the SPWB, in which case the epoxy filling material is applied only between the IC chips 11 and 12 and the MCM tile 13, or only between the chips, the tile and the IPWB 15.

An alternative that simplifies the process is to use an anisotropic conductive polymer in place of both 33 and 41. The anisotropic conductive polymer functions both as an underfill material, and also provides an effective low impedance ground connection for the RF chip 11. In this embodiment, it is most expedient to ground all the chips in the MCM tile by the same technique.

It should be evident that the invention is applicable to PWB interconnection arrangements wherein the intermediate PWB has an opening that extends completely through the thickness of the board and the MCM is mounted so as to recess significantly below the surface of the board, thus reducing the package profile. This PWB structure is described and claimed in U.S. Pat. No. 5,608,262, issued Mar. 4, 1997. Typically such structures are quadrangular in shape, and frequently square in shape. The interior opening in these structures is typically congruent with the outer geometry and has, for the purpose of defining the invention, a picture frame structure. To implement the invention it is evident that when the IPWB is bonded to the SPWB the dimensions, in particular the thickness, of the elements in the MCM should be such that the metallized surface of the RF chip is nearly in contact with said SPWB. Accordingly, to achieve that result, the thickness separating the interconnections between the interconnect substrate and the IPWB and the interconnections between the IPWB and the SPWB should be approximately the thickness of the RF chip, as in the MCM configuration shown in FIGS. 2 and 3. In more complex MCM configurations, the RF chip may be flip chip bonded to another chip in the MCM (which configuration should be regarded as within the scope of the invention). In this case the combined thickness of the chips should approximate the thickness separating the interconnections between the substrate and the IPWB and the interconnections between the IPWB and the SPWB. A more direct way to specify this relationship is that with the IPWB installed on the SPWB, the metallized surface of the RF chip, and the array of interconnection sites interconnecting the IPWB with the SPWB, are essentially coplanar.

As shown in FIGS. 2 and 3 the IPWB has two arrays of interconnection sites, one array on one side of the picture frame structure, and adapted to interconnect with a corresponding array of interconnection sites on the SPWB, and a second array of interconnection sites on the other side of said IPWB adapted to be interconnected to a corresponding interconnection array on the interconnect substrate of the MCM. The interconnect substrate of the MCM also has two array of interconnection sites, but both arrays are on the same side of the interconnect substrate. One array, the outer array typically around the periphery of the interconnect substrate, is adapted to interconnect with the IPWB, as just described, and the other array, an inner array, is adapted to be interconnected to a corresponding array on the RF IC chip.

Also for the purpose of defining the invention, in particular the configuration in which the RF chip is interconnected to the interconnect substrate, the RF chip has a circuit side where the IC is fabricated, and an underside which according to a feature of the invention is metallized. When the RF chip is flip chip bonded to form the MCM tile, the circuit side is bonded to the interconnect substrate, and the metallized surface is exposed. The MCM tile is also bonded "upside down" to the IPWB so that when the IPWB is attached to the SPWB the exposed metallized surface of the RF chip is adjacent the SPWB to allow direct bonding between them.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. An IC MCM package comprising:
   a. a system printed wiring board (SPWB) having a first surface, an array of SPWB interconnection sites and a common ground plane interconnection site on said surface,
   b. an intermediate printed wiring board (IPWB) having a picture frame structure with a first array of IPWB interconnection sites on one side of said picture frame structure and a second array of IPWB interconnection sites on the other side of said picture frame structure, said IPWB being interconnected to said SPWB with said first array of IPWB interconnections sites bonded to said array of SPWB interconnection sites,
   c. a multichip module (MCM) comprising:
      i. an interconnection substrate with a first array of substrate interconnection sites adapted to be interconnected to an IC chip,
      ii. a second array of substrate interconnection sites on the interconnection substrate on the same side of the interconnection substrate as the said first array of substrate interconnection sites, said second array of substrate interconnection sites adapted for interconnection with said second array of IPWB interconnection sites, and
      iii. at least one IC chip having a circuit side and an underside, with an array of chip interconnection sites on said circuit side of said IC chip, said array of chip interconnection sites bonded to said first array of substrate interconnection sites, said IC chip comprising an RF circuit on said circuit side of said chip and a metallization layer on said underside of said chip, said MCM being interconnected to said IPWB with said second array of substrate interconnection sites being bonded to said second array of IPWB interconnection sites, so that the metallization layer on the IC chip is located adjacent the common ground plane interconnection site of the SPWB, the IC MCM package further including means for bonding said metallization layer of said IC chip directly to said common ground plane interconnection site of the SPWB.

2. The IC MCM package of claim 1 wherein the means for bonding said metallization layer of said IC chip to said common ground plane interconnection site is solder.

3. The IC MCM package of claim 1 in which the picture frame is filled with epoxy.

4. The IC MCM package of claim 1 in which the picture frame is filled with anisotropic conductive polymer and the means for bonding said metallization layer of said IC chip to said common ground plane interconnection site is anisotropic conductive polymer.

5. The IC MCM package of claim 2 in which the said means for bonding comprise conductive epoxy.

6. The MCM package of claim 1 wherein the said first array of IPWB interconnection sites and said metallization layer are essentially coplanar.

7. The MCM package of claim 1 in which said second array of substrate interconnection sites is located around the periphery of said interconnection substrate.

* * * * *